United States Patent [19]
Fishkin et al.

[11] Patent Number: 6,027,574
[45] Date of Patent: Feb. 22, 2000

[54] METHOD OF DRYING A SUBSTRATE BY LOWERING A FLUID SURFACE LEVEL

[75] Inventors: Boris Fishkin, San Carlos; John S. Hearne, Los Altos; Robert B. Lowrance, Los Gatos, all of Calif.

[73] Assignee: Applied Materials, Inc., Santa Clara, Calif.

[21] Appl. No.: 09/216,359

[22] Filed: Dec. 18, 1998

Related U.S. Application Data

[62] Division of application No. 08/908,245, Aug. 7, 1997, Pat. No. 5,884,640.

[51] Int. Cl.[7] ................................. B08B 3/04; B08B 5/00
[52] U.S. Cl. .............................. 134/30; 134/32; 134/34; 134/36; 134/37; 134/95.2; 134/902
[58] Field of Search ................................. 134/2, 25.4, 26, 134/30, 32, 34, 36, 37, 95.2, 902

[56] References Cited

U.S. PATENT DOCUMENTS

| | | | |
|---|---|---|---|
| 4,643,774 | 2/1987 | Kishida et al. | 134/1 |
| 4,714,086 | 12/1987 | Kishida et al. | 134/83 |
| 4,722,752 | 2/1988 | Steck | 134/25.4 |
| 4,984,597 | 1/1991 | McConnell et al. | 134/95 |
| 5,520,744 | 5/1996 | Fujikawa et al. | 134/11 |
| 5,569,330 | 10/1996 | Schild et al. | 134/1 |
| 5,575,079 | 11/1996 | Yokomizo et al. | 34/78 |
| 5,660,642 | 8/1997 | Britten | 134/30 |
| 5,714,203 | 2/1998 | Schellenberger | 427/378 |
| 5,752,532 | 5/1998 | Schwenkler | 134/102.3 |
| 5,807,439 | 9/1998 | Akatsu et al. | 134/32 |

FOREIGN PATENT DOCUMENTS

| | | |
|---|---|---|
| 0385536B1 | 2/1990 | European Pat. Off. . |
| 7-14820 | 6/1993 | Japan . |
| 7-142441 | 6/1995 | Japan . |

OTHER PUBLICATIONS

Li, et al., "Improvement and Evaluation of Drying Techniques for HF–last Wafer Cleaning," Pokorny GmbH, Hüfingerstr. 35, D–78166 Donaueschingen, Germany (Interuniversity Microelectronic Center (IMEC), Kapeldreef 75, B–3001 Leuven, Belgium) No date.

Locke, et al., "Marangoni Drying: A New Concept for Drying Silicon Wafers," Pokorny GmbH, Hüfingerstr. 35, D–78166 Donaueschingen, Germany (Interuniversity Microelectronic Center (IMEC), Kapeldreef 75, B–3001 Leuven, Belgium) No date.

Pokorny Brochure—Pokorny GmbH, Hüfingerstr. 35, D–78166 Donaueschingen, Germany (Interuniversity Microelectronic Center (IMEC), Kapeldreef 75, B–3001 Leuven, Belgium) No date.

*Primary Examiner*—Zeinab El-Arini
*Attorney, Agent, or Firm*—Janah & Associates

[57] ABSTRACT

A method of removing liquid on a substrate, the method comprising the steps of placing the substrate in a fluid reservoir having a surface level, maintaining a partial pressure of vapor over the fluid surface level, lowering the fluid surface level of the reservoir while adding fluid, whereby the liquid flows off the substrate, and holding the substrate at different holding points, while lowering the fluid surface level so that the lowering surface level does not pass across a holding point that is being used to hold the substrate.

42 Claims, 5 Drawing Sheets

METHOD OF DRYING A SUBSTRATE BY LOWERING A FLUID SURFACE LEVEL

CROSS-REFERENCE

This application is a divisional of U.S. patent application Ser. No. 08/908,245, filed on Aug. 7, 1997, now U.S. Pat. No. 5,884,640, which is incorporated herein by reference.

BACKGROUND

The present invention relates to a method and apparatus for drying substrates.

Substrate drying apparatus are used in the manufacture of integrated semiconductor circuits, display screens comprising liquid crystals, electrical circuits on boards or synthetic material, and video or phonorecords. In these processes, substrates of semiconductor, ceramic, and polymer materials are treated with liquids, for example, by immersion in etchant vats for etching the substrate, developing vats for developing exposed photoresist layers on the substrate, galvanic vats for deposition of metals on the substrate, or rinsing vats for cleaning the substrates. After treatment in the liquid, the thin film of liquid residue that remains on the substrate is removed by a drying process.

Several conventional methods are used to dry the substrate. The centrifuge or "spin-dry" method uses a centrifuge which is rapidly rotated about an axis transverse to the surface of the substrate. Centrifugal force generated by the rapid rotation forcibly ejects most of the residual liquid on the substrate. However, conventional centrifuging apparatus and processes have several disadvantages. First, evaporation of the thin film of water left on the substrate after high speed rotation of the substrate can cause spotting and streaking due to small amount of nonvolatile matter dissolved in the water. Furthermore, centrifuging methods often leave contaminant residue on textured substrate surfaces having features or holes that capture the residue.

An improved centrifuging process described in U.S. Pat. No. 5,271,774, to Leenaars, et al., flows a vapor that is miscible with liquid on the substrate surface, during the centrifuging process, to reduce the contaminants left on the substrate. The vapor mixes with the liquid residue on the substrate to form a solution having a lower surface tension that is more easily ejected from the substrate during centrifuging to leave behind less contaminant residue. However, even the improved centrifuging processes and apparatus are complex and prone to breakdown due to mechanical problems resulting from the high speed rotation of the substrate. Because the centrifuge spin dryers rely on centrifugal force to "throw" water off the wafer surfaces, mechanical stresses often break or damage large or thin substrates. Also, moving parts inside the centrifuge erode to form contaminant particles which deposit on the substrate. Furthermore, static electricity formed on the substrate surface during high speed rotation of the substrate in the dry atmosphere can attract oppositely charged airborne contaminant particles onto the substrate.

A preferred method for drying advanced VLSI and ULSI integrated circuit substrates uses the Marangoni principle, which holds that fluid flows from lower to higher surface tension regions across a fluid surface. One type of Marangoni dryer operates by immersing a substrate in a tank containing liquid and flowing miscible vapor over the liquid. Liquid added from the bottom of the tank overflows over the walls of the tank. The continuously overflowing liquid results in a non-uniform concentration of dissolved vapor, and resultant surface tension gradients, across the liquid surface. In conventional Marangoni dryers, the substrates are held in a cassette holder immersed in water, and the substrates are slowly lifted from the fluid using a complex robotic mechanism that pulls the substrates out from the tank. As the substrates are pulled out, residual liquid on the substrate flows off the substrate surface, in the direction of the higher surface tension regions on the liquid surface, thereby drying the substrate. The robotic pulling mechanisms are typically positioned in a lid that forms the top of the dryer chamber or under the substrates at the bottom of the dryer chamber or tank.

However, conventional Marangoni drying systems have several problems. The complex robotic pulling mechanisms used to pull out the substrates are prone to failure and have high maintenance costs. Also, the pulling device has mechanical parts which move and wear out seals. The worn parts form contaminant particles that deposit on the substrate. Furthermore, vibrations of the robotic pulling mechanism can disturb the flow of residual liquid off the substrate surface. Furthermore, where the robotic lifting mechanism touches portions of the substrates, residual liquid remaining at the contact points on the substrate surface causes streaks and stains to form on the substrate.

Yet another problem with conventional Marangoni drying systems arises because the inlet and exhaust for the vapor introduced into the chamber do not provide a uniform distribution of vapor across the liquid surface. In conventional systems, the flow rates and flow pattern of vapor across the surface of the liquid from the vapor inlet to the vapor exhaust change as a function of the height of the substrates or level of fluid in the reservoir. It is desirable to have a uniform flow of vapor across the surface of the fluid to provide more consistent drying of the liquid residue on the substrate surface.

Thus, it is desirable to have substrate drying apparatus and method that can remove residual liquid films on a substrate surface efficiently without leaving behind contaminants or stains. It is further desirable to have a drying apparatus that provides a uniform flow of vapor across the surface of the fluid in the apparatus. It is also desirable to control the level and flow rate of fluid in the tank to maintain uniform surface tension gradients across the liquid surface, particularly at the intersection of the surface of the substrate with the surface level of the drying fluid. It is further desirable for the apparatus and method to operate with low maintenance costs and to provide high processing throughput.

SUMMARY

An apparatus and method, according to the present invention, removes residual liquid on a substrate without leaving behind residues. In one embodiment, the method comprises the steps of immersing a substrate in fluid having a fluid surface level, maintaining a partial pressure of vapor over the fluid, lowering the fluid surface level of the fluid while adding fluid, and holding the substrate at different holding points on the substrate, while lowering the fluid surface level so that the lowering fluid surface level does not pass across a holding point that is being used to hold the substrate.

In a preferred embodiment, the method comprises a first stage in which the fluid surface level is lowered through a first range of levels while holding the substrate at first holding points outside the first range of levels; and at least one second stage, in which the fluid surface level is lowered through a second range of levels while holding the substrate at second holding points outside the second range of levels.

In another aspect, the method comprises the steps of immersing the substrate in fluid having a fluid surface level, maintaining a partial pressure of vapor over the fluid surface level by introducing vapor through vapor inlet ports that move in relation to the fluid surface level, while adding fluid, and lowering the fluid surface level, whereby liquid residue flows off the substrate.

The present invention further encompasses a drying chamber for drying substrates having residual liquid thereon. The drying chamber comprises a fluid dispenser for dispensing fluid into a reservoir. Means for holding at least one substrate in the fluid in the reservoir while lowering the fluid surface level relative to the substrate is provided. The chamber further comprises a vapor inlet that moves in relation to the lowering fluid surface level, the vapor inlet having an inlet port for introducing vapor above the reservoir. Preferably, the drying chamber comprises a vapor distributor comprising a floating vapor inlet or a floating vapor exhaust that floats on the fluid surface level. The vapor inlet has an inlet port for introducing vapor into the chamber, and the vapor exhaust has an exhaust port for exhausting the vapor in the chamber. Lowering the fluid surface level relative to the substrate causes residual liquid to flow off the substrate.

In another embodiment, the present invention comprises a computer program product for operating a drying chamber for drying a substrate having residual liquid thereon. The program product comprises a computer-usable medium having embodied therein computer readable program code means comprising vapor distribution control code for introducing vapor into the chamber, fluid system control code for dispensing fluid into a reservoir and adjusting a surface level of the fluid in the reservoir, and multi-point holder control code for actuating a multi-point holder to hold the substrate at different holding points on the substrate so that a lowering fluid surface level does not pass across a holding point that is being used to hold the substrate.

BRIEF DESCRIPTION OF THE DRAWINGS

These and other features, aspects, and advantages of the present invention will become better understood with regard to the following description, appended claims, and accompanying drawings which illustrate examples of the invention, where:

DETAILED DESCRIPTION OF THE INVENTION

The present invention provides an apparatus and method for drying substrates after wet processing or fluid treatment of the substrate, and is illustrated by way of an exemplary system suitable for drying semiconductor wafers. It should be understood that the same general principles apply to drying of other wet objects in other applications, as would be apparent to one of ordinary skill in the art of drying objects, without deviating from the scope of the invention. In semiconductor fabrication, drying operations are used to remove residual fluids that remain on the semiconductor substrate after it is treated in a liquid and cleaned, such as polishing slurry, etchants, photoresist, strippers, or other residues. The substrate drying process and apparatus described herein can be used in a variety of semiconductor substrate processing operations, including chemical mechanical polishing, diffusion, ion implantation, epitaxial growth, and chemical vapor deposition. For example, the present invention is useful for drying substrates that have been chemical-mechanically polished, cleaned, and rinsed using deionized water. The drying apparatus and method are also useful for pre-diffusion cleaning of substrates, i.e., cleaning of the substrate before dopants are diffused into oxide, or for cleaning the substrate prior to epitaxial growth of silicon to ensure that the epitaxially grown layers have uniform crystalline structures consistent with the underlying substrate and not adversely effected by impurities on the substrate.

Figures 1, 2:
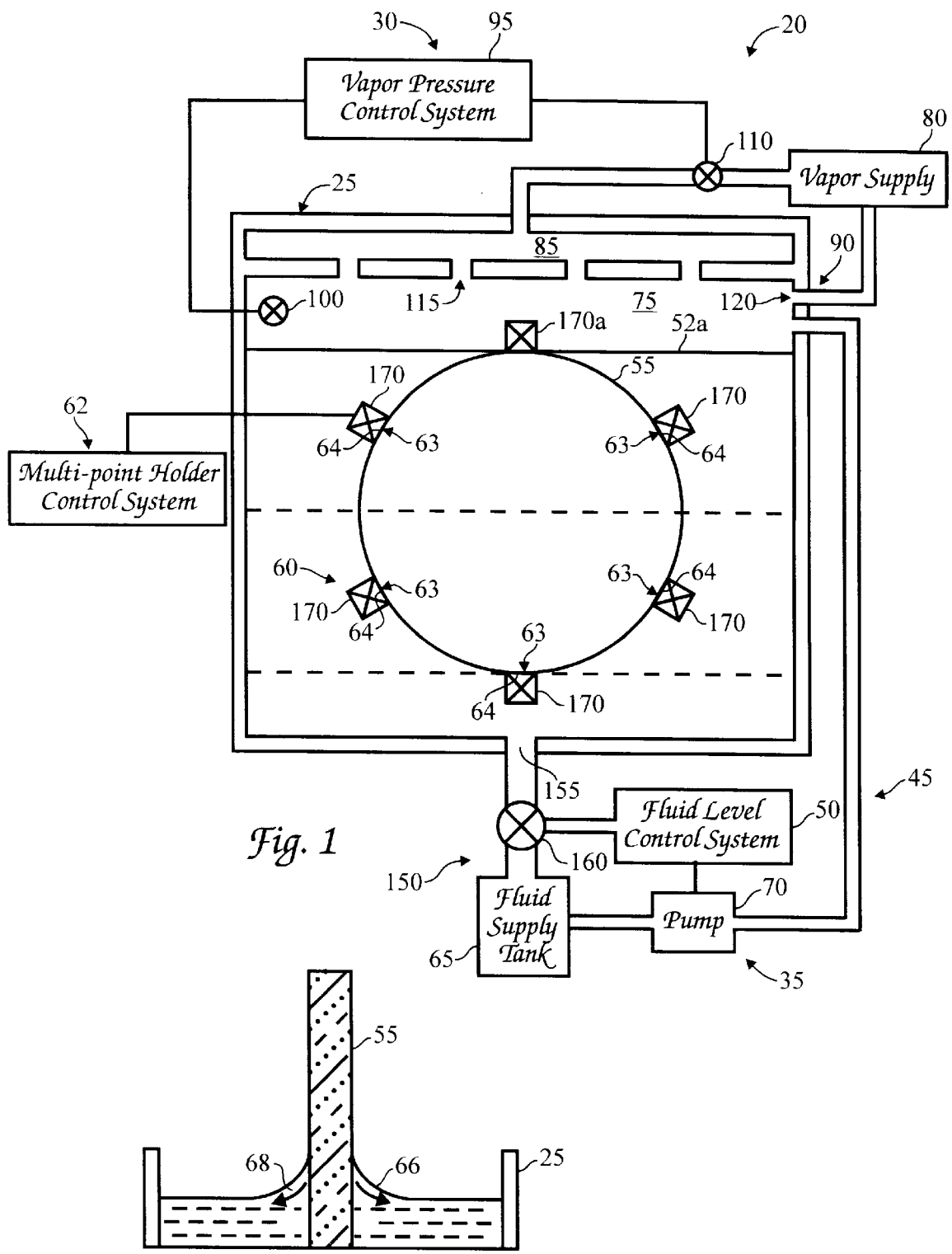
FIG. 1 is a schematic sectional view of a substrate drying system of the present invention.
FIG. 2 is a schematic sectional view of the fluid meniscus at the interface of a substrate surface and a fluid surface.

In one embodiment, as illustrated for example in FIG. 1, the drying apparatus 20 of the present invention comprises a drying chamber 25 having a vapor distributor 30 for introducing vapor into the chamber. A fluid distribution and containment system 35 of the drying chamber 25, comprises (i) a reservoir 40 for containing fluid therein, (ii) a fluid dispenser 45 for introducing fluid into the reservoir, and optionally, (iii) a fluid level control system 50 for lowering the fluid surface level 52 in the reservoir causing residual liquid to flow off the substrate surface. A substrate holder 60 holds a single substrate or a stack of substrates in the reservoir 40 and the reservoir filled with liquid. The substrate holder 60 can comprise a holder that raises the substrates above the fluid surface level 52 using a robotic holding and lifting system, or a holder that holds the substrates in a single position. FIG. 1 illustrates a substrate holder 60 comprising a multi-point holder 62 for holding substrates at different holding points 63 such that the lowering fluid surface level 52 does not intersect, cross, or pass through a holding point that is being used to hold the substrates 55. The multi-point holder 62 comprises holding surfaces 64 for holding the substrate 55 at different holding points 63 on the substrate, and a control system for actuating and controlling operation of the holding surfaces 64 and their holding position on the substrate. The different holding points 63 are varied in relation to the position of the fluid surface level 52 so that residual liquid can flow off the substrate surface without intersection of the fluid surface level 52 with the holding points 63 on the substrates, thereby uniformly drying the substrates substantially without forming stains or streaks.

The drying apparatus 20 uses Marangoni drying principles to dry the substrates 55. The vapor introduced into the chamber through the vapor distributor system 30 is miscible with, and dissolves in, the fluid in the reservoir 40. The concentration gradient of vapor dissolved in the fluid across the surface of the fluid gives rise to different surface tension forces across the fluid surface. The difference between the low surface tension adjacent to the substrate 55 and the high surface tension distal from the substrate, causes the residual liquid film on the substrate to be pulled-off the substrate when the substrate is gradually removed from fluid (or when the fluid is gradually drained from the surface of the substrate). The vapor dissolves in portions of the fluid to provide first regions having first surface tension forces, typically, at the fluid regions exposed for extended periods to higher vapor concentrations, such as in the meniscus 66 of fluid along the substrate surface and fluid interface, as shown in FIG. 2. Fluid is added to the fluid already in the reservoir 40 at a sufficient rate to provide second regions having second surface tensions. The second surface tension regions form at portions of the fluid surface distal from the substrate surface where freshly introduced fluid contains a lower concentration of vapor dissolved in the fluid. The second surface tension forces are typically higher than the first surface tension forces creating a net driving force away from the substrate surface. The surface tension forces in the direction from the lower surface tension regions to the higher surface tension regions, as shown by the arrow 68, causing the residual liquid on the substrate 55 to flow off the substrate, when the substrate 55 is removed from the reservoir 40 or the fluid surface level 52 in the reservoir is lowered.

The drying chamber 25 comprises a conventional chamber shaped and sized to hold the reservoir 40 and a substrate holding mechanism 60. The chamber 25 can comprise a reservoir 40 that is a separate structure or that is integral to the chamber. Preferably, the reservoir 40 comprises a container shaped and sized to hold one or more substrate holders 60, such as cassettes of wafers, completely immersed in liquid. The reservoir 40 can be sized to accommodate one or more SEMI (Semiconductor Equipment and Materials Institute) approved wafer cassette carriers arranged side by side. The reservoir 40 is typically formed from a material (such as a polymer) that is not chemically reactive with the fluid. A fluid dispenser system 45 dispenses fluid into the reservoir 40 in the vapor chamber 25 through a nozzle located in or close to the bottom of the chamber. The fluid dispenser 45 comprises a fluid line from a supply tank 65, a pump 70 or other such means to transport fluid, and a fluid level control system 50 that controls the flow of fluid to the reservoir 40 at a flow rate sufficient to maintain a steady state concentration gradient of vapor dissolved across the surface of the fluid in the reservoir 40 during operation of the drying apparatus 20.

The chamber 25 forms an enclosed vapor zone 75 that contains vapor. The vapor distributor system 30 comprises a vapor supply 80, such as a bubbler system, that provides vapor to a vapor inlet 85 in the chamber 25. The vapor inlet 85 is typically positioned at the upper region of the apparatus 20 above the fluid surface level 52, and can be either integrated into the lid of the apparatus or can float on the liquid surface in the reservoir 40 as described below. A vapor exhaust 90 is placed in relationship to the vapor inlet 85 so that vapor introduced above the liquid surface in the chamber 25 flows past the substrate surfaces and directly into the exhaust unimpeded by obstructions in the chamber 25. The vapor inlet 85 can also be positioned on one side of the substrates 55 and the vapor exhaust 90 on the other side, and in facing relationship, so that the vapor flows across and past the substrate surfaces and into the exhaust. Typically, the chamber operates at ambient pressure. Alternatively, a vapor pressure control system 95 can be used to monitor the partial pressure of vapor in the chamber 25 using a pressure sensor 100. The vapor pressure control system 95 uses the monitored signal to control a mass flow controller 110 that controls the pressure of gas upstream from the bubbler and directs the mixture of bubbler gas and vapor to the chamber. The vapor inlet ports 115 and vapor exhaust ports 120 comprise one or more nozzles or slits, which are sized and spaced apart to release vapor uniformly past the substrate surfaces. For example, the ports 115, 120 can comprise longitudinal slits having an axis parallel to the plane of the wafer surface or a plurality of spaced apart holes. Preferably, sets of holes are positioned along the length of a tube that extends along the liquid surface to provide a stream of vapor adjacent to the substrate surfaces. Preferably, the ports 115, 120 have diameters of about 1 to 10 mm, and are positioned to supply vapor to the liquid-air-substrate interface level.

Figure 3A:
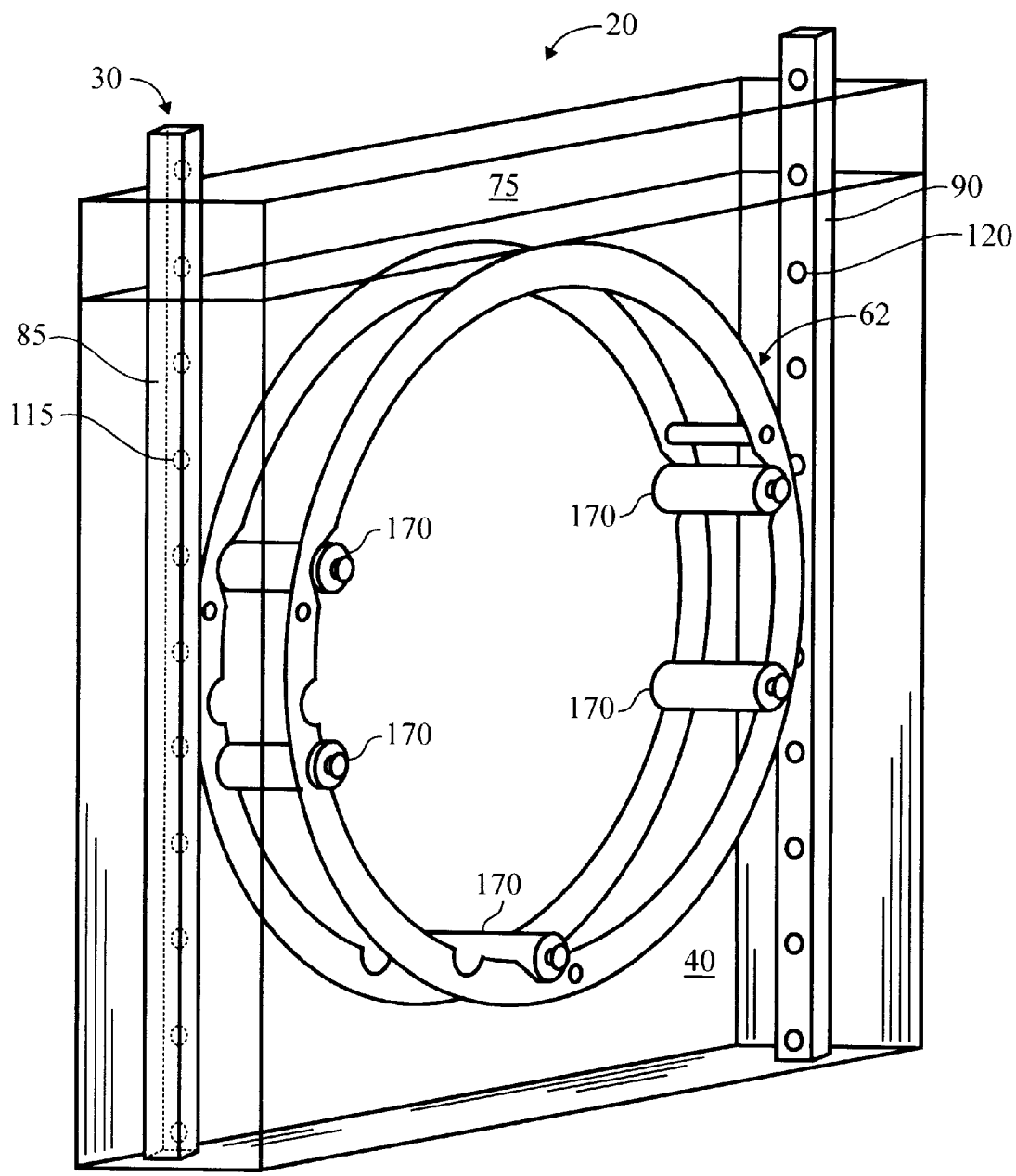
FIG. 3a is a schematic perspective view of the apparatus of the present invention showing a multi-point holder with roller type holding clamps.

In the version illustrated in FIG. 3a, the vapor distributor 30 comprises a vapor inlet 85 and a vapor exhaust 90 that are both longitudinal tubes positioned along the sides of the reservoir 40 and extending through the entire height of the reservoir 40. The vapor inlet 85 and a vapor exhaust 90 comprise a plurality of on/off switchable inlet ports 115 and exhaust ports 120, respectively, which are uniformly distributed across the top, middle, and bottom sections of the chamber 25. Vapor is supplied from an open top inlet port and exhausted through an open top exhaust port when the fluid surface level 52 is close to the top of the chamber, the other ports being closed. As the fluid surface level 52 is gradually lowered, the other switchable inlet and exhaust ports at lower positions are switched on, for example the top ports are switched off and the next lower ports are switched on, to redirect the vapor flow through the lower ports to maintain a fresh supply of vapor 80 at the fluid surface level 52. Use of only a top inlet and exhaust ports during lowering of the fluid surface level 52 would result in a vapor flow path from the top inlet port directly to the top exhaust port that limits contact of vapor with the fluid surface level 52, particularly when the fluid surface level is being lowered in the reservoir 40. It is preferred to redirect the flow of vapor to regions close to the fluid surface during lowering of the fluid surface level 52 to increase dissolution of the vapor in the fluid.

Figure 4:
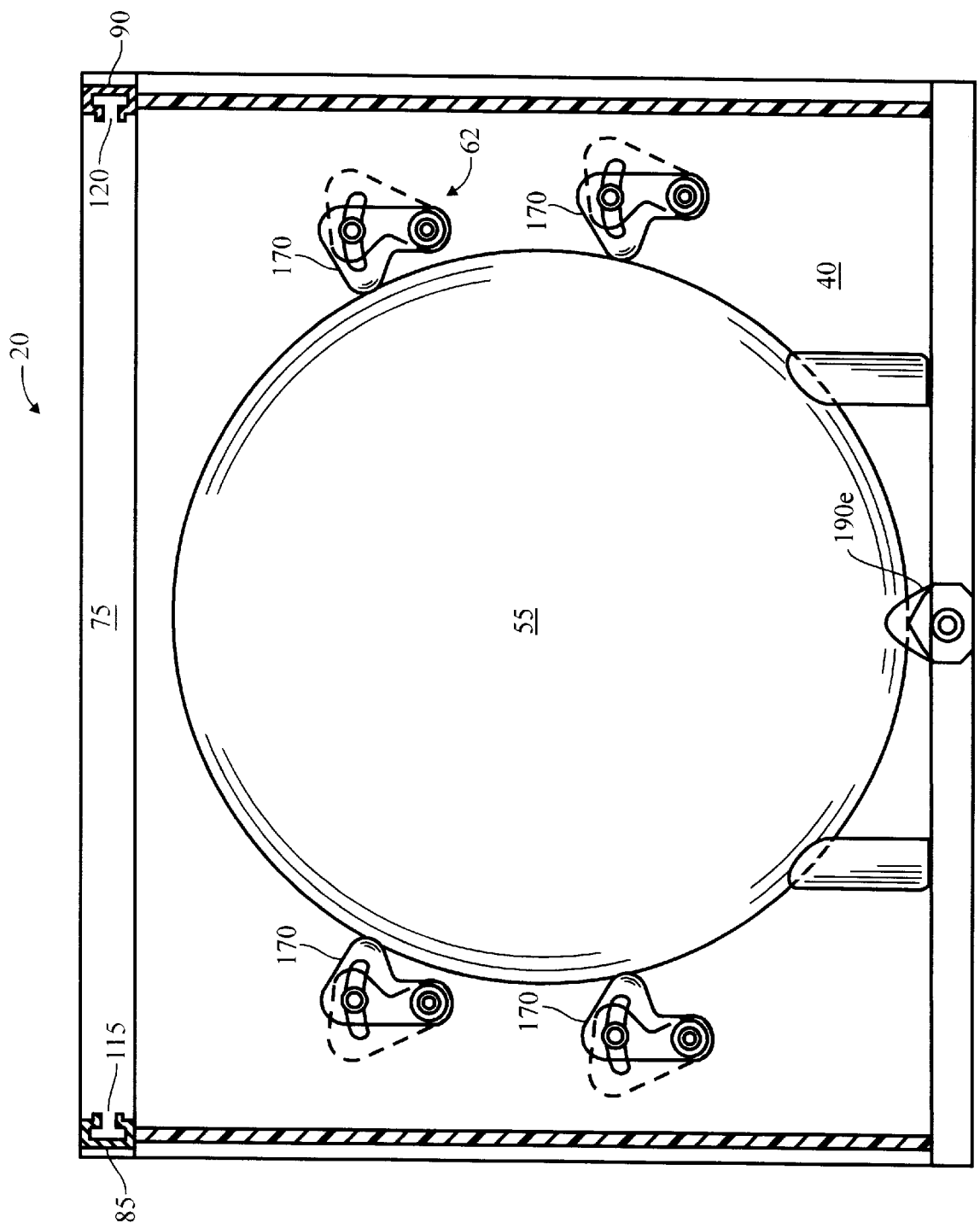
FIG. 4 is a schematic sectional front view of another embodiment of the apparatus of the present invention showing the multi-point holder in the open and closed positions.
Figure 5A:
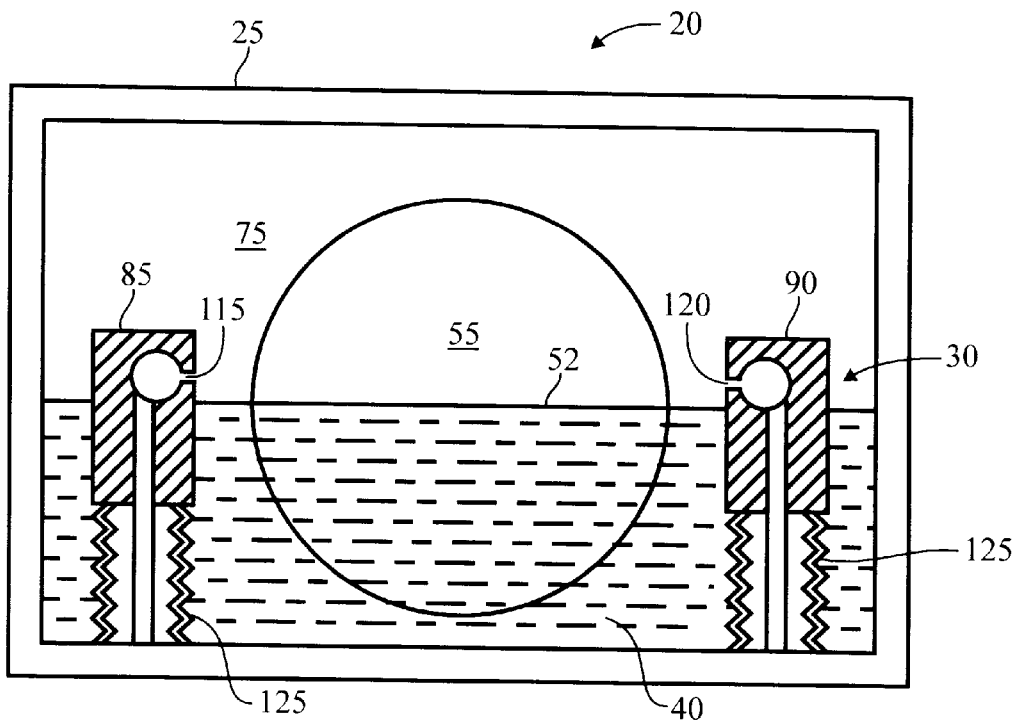
FIG. 5a is a schematic front sectional view of another embodiment of the apparatus of the present invention comprising movable vapor inlets and exhausts.
Figure 5B:
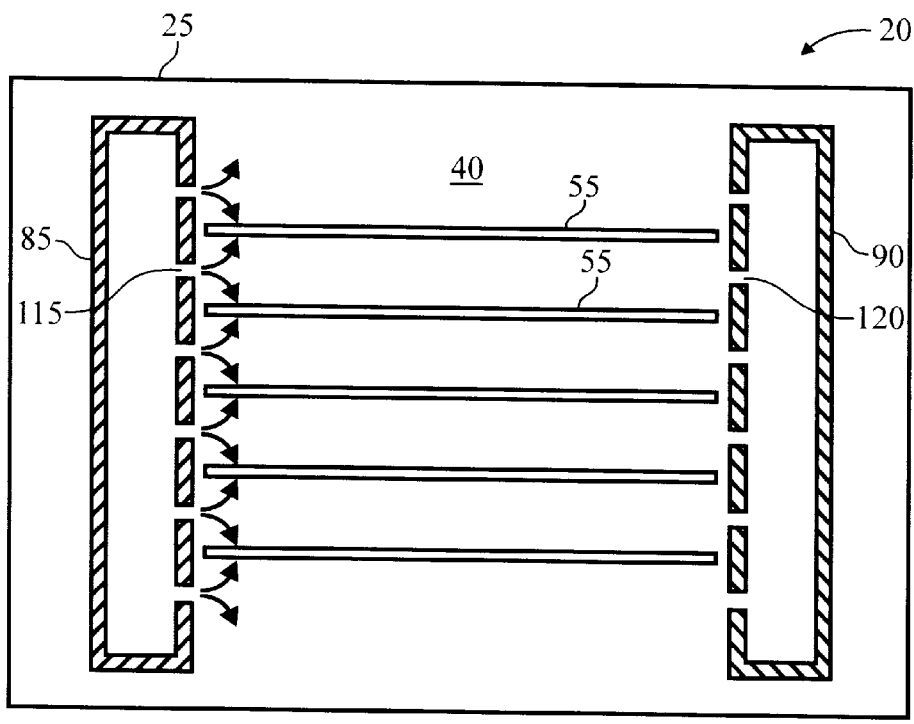
FIG. 5b is a top view of the apparatus of FIG. 5a showing the inlet ports of the vapor inlet and the exhaust ports of the vapor exhaust.

In another preferred version as illustrated in FIG. 4, the vapor distributor 30 comprises one or more movable vapor inlets 85 that move in relation to the lowering fluid surface level 52, the vapor inlets having inlet ports 115 for introducing vapor into the chamber 25. In this version, suitable means are used for holding one or more substrates in the reservoir and lowering the fluid surface level 52 relative to the substrates. For example, the fluid surface level 52 can be lowered relative to the substrate surface by draining the fluid in the tank 65 or by raising the substrates 55 from the tank. The vapor distributor 30 preferably also includes a movable vapor exhaust 90 that also moves in relation to the lowering fluid surface level 52, the vapor exhaust having exhaust ports 120 for exhausting the vapor in the chamber 25. Preferably, the inlet ports 115 on the vapor inlet and the exhaust ports 120 of the vapor exhaust 90 are substantially in facing relationship to one another, and more preferably directly opposing one another and positioned on either side of a substrate surface, as shown in FIG. 5b. This arrangement allows the fresh vapor to be introduced immediately over the surface of the fluid and adjacent to the substrate 55 and exhausted directly therefrom.

The movement of the movable vapor inlet and exhaust 85, 90 can be controlled using suitable control means so that the inlet and exhaust are moved in relation to the lowering fluid surface level 52. For example, the movable vapor inlet 85 and/or exhaust 90 can move along a ratchet or worm drive that moves according to the movement of the fluid surface level 52 relative to the substrate surface. A computer controlled robotic assembly (not shown) can also be used to move the vapor inlet 85 in relation to, and preferably to match the rate of, movement of the fluid surface level 52. Preferably, the movable vapor inlet 85 and exhaust 90 comprise floating vapor inlets and floating vapor exhausts that float on the fluid surface level 52, as shown in FIG. 5a. The floating vapor inlet 85 and exhaust 90 are provided with flexible gas lines that allow transport of the vapor through the lines without excessive leakage while allowing the inlet and exhaust to move freely in the chamber 25, such as collapsible bellows 125 having vapor channels for transporting vapor therethrough. The floating vapor inlet 85 and exhaust 90 provide means to simply and effectively control and guide movement of the vapor distributor system 30.

In a preferred embodiment, the fluid system 35 further comprises a fluid level adjuster 150 for controlling and gradually lowering the level of the fluid surface in the reservoir 40. The fluid level adjuster 150 typically comprises a fluid level control system 50 which operates a valve 160 in the fluid inlet tube or drain 155 of the reservoir 40. The drain 155 is located in the bottom wall of the reservoir 40 and immediately below the substrates 55 to allow the fluid surface level 52 to gradually recede across the substrate surface and from the top to the bottom of the substrate. When the fluid level adjuster 150 lowers the fluid level, the difference in the first and second surface tensions at the fluid surface level 52 causes the liquid residue film on the substrate surface to flow off the substrate surface. Preferably, the fluid level adjuster 150 comprises a fluid level control system 50 having a closed control loop system which monitors the level of fluid in the reservoir 40 and adjusts the opening side of a drain valve 160 to obtain a preprogrammed rate of fluid level descent. Alternatively, the drain valve 160 can be preset to provide the opening size that results in the desired fluid surface level drain rate, or fluid can be removed from the reservoir 40 by a pump. The draining control system serves as means for lowering the level of the fluid surface around the substrate 55 through a range of levels. However, many other means can be used to control the level of fluid in the reservoir 40. For example, the fluid level can be lowered by lowering the entire reservoir assembly while holding the substrate holder 60 in a fixed position. Thus, the present invention should not be limited to the fluid lowering means described herein, and includes other fluid lowering means apparent to one of ordinary skill.

Figure 3B:
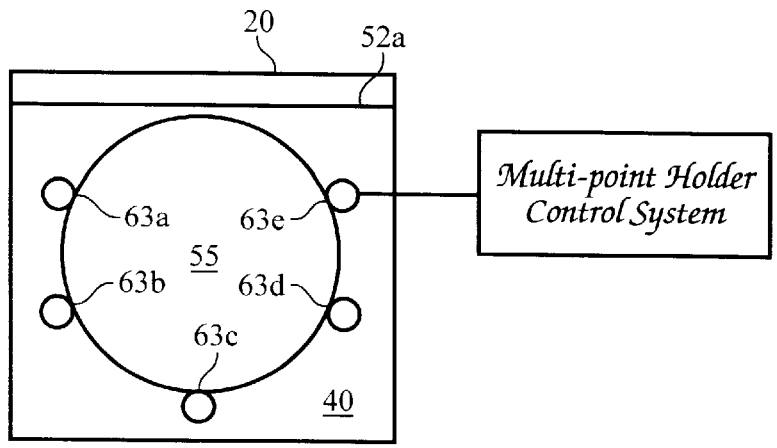
FIG. 3b is a schematic sectional front view of the apparatus of FIG. 3a showing the substrates immersed below a fluid surface level in the reservoir.
Figure 3C:
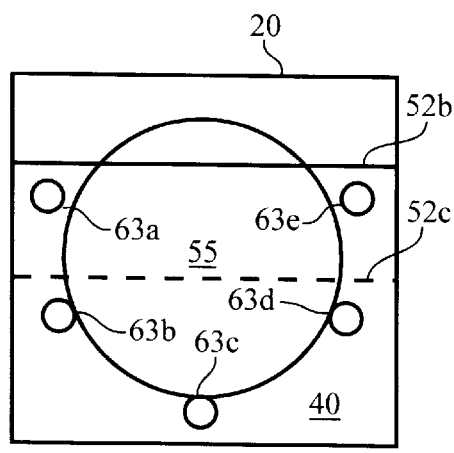
FIG. 3c is a front view of the apparatus of FIG. 3a showing the multi-point holder holding the substrate during lowering of the fluid surface level through a first range of fluid levels.
Figure 3D:
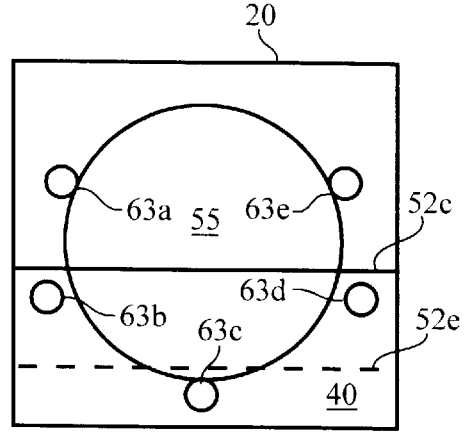
FIG. 3d is a front view of the apparatus of FIG. 3a showing the multi-point holder holding the substrate during lowering of the fluid surface level through a second range of fluid levels.
Figure 3E:
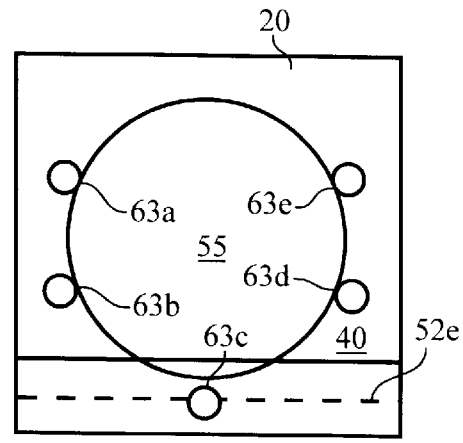
FIG. 3e is a front view of the apparatus of FIG. 3a showing the multi-point holder holding the substrate during lowering of the fluid surface level through a third range of fluid levels.

The multi-point holder 62 holds the substrate 55 at different holding points 63 on the substrate surface (which are preferably on the perimeter edge of the substrate) while the fluid surface level 52 is being lowered so that the slowly lowering fluid surface level 52 does not pass across or intersect any of the holding points 63 on the substrates, as for example illustrated in FIGS. 3b to 3e. Typically, the multi-point holder 62 comprises one or more holding surfaces 64 positioned to hold different portions of the perimeter edge of the substrate (along the thickness portion of the wafer) at different times. A multi-point holder control system comprising a programmed computer system and suitable control code embodied in computer readable medium, with a user interface for programming the computer, controls operation of the holding clamps. In the activated position, the control system actuates the holding clamps 170 to press their holding surfaces 64 against the substrate 55, and in the deactivated position, the holding surfaces 64 of the holding clamps 170 is withdrawn or removed from the substrate to provide no contact with the substrate. For example, as shown in FIG. 3b, the multi-point holder 62 holds the substrates 55 at holding points 63a–e while the fluid surface level 52a is above the substrate. As further shown in FIG. 3c, the multi-point holder 62 holds the substrates 55 at first holding points 63b,c,d while the fluid surface level 52b is lowered through a first range of levels 52b to 52c that do not pass across the first holding points 63b,c,d. Thereafter, as illustrated in FIG. 3d, the multipoint holder 62 holds substrate 55 at second holding points 63a,c,e while the fluid surface level 52c is lowered through a second range of levels 52c to 52d that do not pass across the second holding points 63a,c,e. The multi-point holder 62 can also hold the substrates 55 at third, fourth or additional sets of holding points, for example the holding points 63a,b,d,e while the fluid surface level 52 is lowered through an additional ranges of levels 52d to 52e that do not pass across these particular holding points 63, as for example illustrated in FIG. 3e.

Preferably, the multi-point holder 62 comprises at least two holding clamps 170 capable of holding the substrate 55, or a holder 60 containing a plurality of substrates, at different points 63 along the substrate or the holder. The holding clamps comprise contact surfaces capable of holding a top, middle, and bottom portion of the substrate 55. Preferably, the multi-point holder 62 comprises (i) a first holder clamp for holding the substrate 55 at first holding points while the fluid surface level 52 is lowered through a first range of levels outside the first holding points, and (ii) at least one second holder clamp for holding the substrate at second holding points 63 while the fluid surface level 52 is lowered through a second range of levels outside the second holding points. In one version, the holding clamps comprise a set of one or more jaws positioned around the substrate 55 to securely hold the substrate within the jaws. For example as illustrated in FIG. 1, a first holding clamp can comprise jaws positioned at the top and on either side of the bottom of the substrate 55, and a second holding clamp can comprise jaws positioned on either side of and at the bottom of the substrate. The first holding clamp is capable of holding a first portion of the substrate 55 while the fluid surface level 52 is lowered through a first range of levels, and the second holding clamp is capable of holding a second portion of the substrate while the fluid surface level 52 is lowered through a second range of levels.

The multi-point holder clamps can comprise many other embodiments that include one or more clamping structures positioned around the perimeter of the substrate 55. In the version illustrated in FIG. 4, the multi-point holder 62 comprises rotatable cams having contact tips that can press against portions of the substrate to hold the substrate 55. The cams rotate about an axis perpendicular to their longitudinal axis so that the cam can be actuated from a contact to a non-contact position. In the non-contact position, the tip of the cam is directed outward from the substrate perimeter. In the actuated position, the cam is rotated so that the tip of the cam presses against the perimeter of the substrate 55. Three or more cams are used to form a triangulated arrangement that holds the substrate 55 in a secure and fixed arrangement. Multiple sets of cams, each set disposed in a separate triangulated or rectangular arrangements can also be used to hold the substrate 55 during the first, second, and subsequent stages of lowering of the fluid surface level 52 in the reservoir 40.

In addition to rotatable cams, rollers, clamping jaws, and other structures that are equivalent in function as would be apparent to one of ordinary skill in the art, can also be used to hold in the substrate 55 in a multi-point holding arrangement. For example, as shown in FIG. 3a, the multi-point holder 62 can comprise rollers having arcuate or cylindrical holding surfaces 64 for pressing against and holding the substrate 55. The rollers are positioned along the perimeter of the substrate 55 in any configuration suitable for holding the perimeter of the substrate 55 at three or more points 63 to provide a more stable holding arrangement. In the example shown herein, a set of six rollers are positioned such that the first and second rollers are positioned at the top and bottom of the substrate 55 and in vertical alignment, and a set of four middle rollers are positioned on either side of the middle of the substrate. The middle rollers are aligned with one another through the horizontal axis through the center of the substrate 55. In the first stage, when the fluid level moves through the first range of levels, some of the rollers are actuated simultaneously to form a first holder clamp holding the substrate 55 at the three equilateral triangulated points 63. When the fluid surface level 52 moves through a second range of levels, a second holder clamp is formed by actuating other rollers to hold the substrate 55 at a different set of points 63 outside the range of levels that the fluid surface level 52 is being lowered. In addition, the multi-point holder 62 can comprise a third or additional sets of rollers that operate as additional holding clamps for further stages of the process.

The multi-point holder 62 can also comprise semicircular members having arcuate surfaces that move in a curved path along the circumference of the substrate (not shown). The arcuate surfaces are rotated to intersect and hold different portions of the substrate perimeter at different times. This version allows the substrate 55 to be held continuously and at different points 63 during lowering of the fluid surface level 52. The arcuate surface is capable of continuously varying the holding points 63 at which the substrate 55 is held. Thus, the present invention should not be limited in scope to the illustrative versions of the multi-point holder 62 provided herein.

In another embodiment, the fluid surface level 52 can be lowered relative to the substrates 55 by raising the substrates above the fluid surface level 52 using a robotic holding and lifting system operated by the control system. In this version, the substrates are slowly lifted from the fluid using a complex robotic mechanism that grips the substrate cassette or holder, or that grips individual substrates, and pulls the substrates slowly out of the tank. The robotic mechanism can be any suitable lifting or pulling-up robot arm, for example, vise grips or vacuum lift systems that can grasp and hold the substrates. As the substrates are pulled out, residual liquid on a substrate flows off the substrate surface, in the direction of the higher surface tension regions on the liquid surface, to dry the substrate. The robotic pulling mechanisms can be positioned in a lid that forms the top of the dryer chamber or under the substrates at the bottom of the dryer chamber or tank. Preferably, a multi-point holder 62 is used to hold the substrates as the fluid surface level 52 is being lowered relative to the substrate surfaces. The multi-point holder 62 holds the substrate 55 at different holding points 63 along the perimeter of the substrate surface, so that the lowering fluid surface level 52 does not intersect or pass through a holding point. In an initial stage, the level of the fluid surface around the substrate 55 is lowered through a first range of levels while holding the substrate surface at first holding points outside the first range of levels; and in second, third, fourth or additional stages, the substrate 55 is held at other holding points while the fluid surface level is lowered through additional ranges of levels that do not pass across the new holding points.

To remove a liquid residue film on a substrate surface, one or more substrates 55 are placed in the reservoir 40, or a stack of substrates is loaded in a substrate holder 60, commonly known as a cassette carrier, which is then placed in the reservoir. FIG. 3a shows an exemplary substrate holder 60 that is lowered or immersed into a reservoir 40 containing fluid having a fluid surface level 52 comprising first and second surface tension regions, so that the fluid surface level 52 covers the substrates 55. The fluid can include any fluid which wets the substrate surface, including deionized and purified water, alcohols, aldehydes, or ketones. The fluid can also be heated to reduce its excess dissolved oxygen which cause silicon oxide to form on silicon substrates 55. During operation of the dryer, fresh fluid is continuously or in a step-wise manner, added to the reservoir 40 to replenish the fresh fluid supply in the reservoir or to overflow the fluid surface level, thereby increasing the vapor concentration gradients between the meniscus of the fluid at the substrate surface and the bulk fluid.

Thereafter, vapor is introduced into the vapor zone above the fluid surface level 52 through the vapor inlets 85 to maintain the desired partial pressure of vapor over the fluid surface. The vapor introduced into the vapor zone is miscible with the fluid. Preferably, the vapor is also an organic compound which is non-reactive to the substrate 55 and is free of contaminants which could physically adhere or chemically react with the substrate surface. Suitable vapors include for example aliphatic alcohols and other organic or inorganic materials that are miscible with the liquid. Preferably, the vapor comprises an alcohol vapor of methanol, propanol, or butanol which mixes with water to lower its surface tension. For example, methanol has a surface tension of 24 dyne/cm, ethanol has a surface tension of 24.1, n-propyl alcohol and isopropyl alcohol have surface tensions of 22.9, acetone has a surface tension of 26.3, methylethylketone has a surface tension of 26.8, and acetic acid has a surface tension of 29.6.

Preferred vapors include isopropanol vapor which is non-toxic and miscible with water. Also, isopropanol has a low surface tension and has both hydrophobic and hydrophilic characteristics, i.e., it is miscible in both oil and water, and it provides the desired surface tension ranges when mixed with water. Preferably, the vapor supply 80 comprises a bubbler that bubbles an inert or non-reactive gas, for example nitrogen, past the surface of a tank of liquid, such as isopropanol. The carrier gas transports the vapor of the isopropanol from the bubbler to the vapor zone. Typically, the flow rate of isopropanol vapor is from about 10 to about 200 ml/min (for each 200 mm diameter substrate in the tank), and the flow rate of nitrogen is from about 0.2 to about 5 l/min (per 200 mm substrate). The flow ratio of miscible vapor to carrier gas is typically from about 0.001 to about 0.03.

During the process, fresh vapor is continually introduced to the vapor zone 75 via the vapor distributor system 30 to maintain the desired partial pressure of a vapor over the fluid surface. Simultaneously, fresh fluid is added to the reservoir 40 through the fluid inlets so that the partial pressure of vapor over the fluid surface causes vapor to dissolve into the fluid surface to provide different surface tension regions in the fluid surface. Typically, the vapor partial pressure and the flow rates are controlled to maintain a surface tension gradient of at least about 20 dyne/cm$^2$ in the fluid surface. The amount of isopropanol liquid typically introduced flowed in a single run is from about 0.1 to about 1 ml, and more typically from about 0.2 to about 0.6 ml.

Gradually, the fluid surface level 52 around the substrate 55 is lowered relative to the substrate surface so that the difference in the first and second surface tensions in the fluid surface cause the residual liquid to flow off the substrate surface. In particular, the meniscus 68 at the interface between the substrate surface and the fluid surface contains a higher concentration of vapor than the portions of the fluid surface distal from the meniscus. The net surface tension gradient pulls off residual liquid from the surface of the substrate 55 during lowering of the fluid surface. The downward velocity of the fluid surface level 52 is maintained at a relatively slow rate to allow the surface tension forces to smoothly and uniformly draw out the residual liquid on the surface of the substrate 55. If the fluid is drained too fast, residual fluid droplets remain on the substrate surfaces and contaminate the substrate surface upon evaporation. Thus, preferably the fluid surface is lowered at a rate such that substantially no residual liquid is left on the substrate surface. Preferably, the fluid surface level 52 is lowered at a rate of 0.7 to 10 mm/sec, and more preferably about 1 to 5 mm/sec. Rates beyond 10 mm/sec result in residual liquid on the surface of the substrate 55, and rates below 1 mm/sec provide low processing throughput.

Preferably, the fluid surface level 52 is lowered without removing the substrates 55 from the reservoir 40 and while using a multi-point holder 62 to hold the substrates. In the version shown in FIGS. 3a to 3e, as the fluid surface level 52 is being lowered, the substrate 55 is held at different holding points 63 at the perimeter of the substrate surface, so that the lowering fluid surface level 52 does not intersect or pass through a holding point. In a first or initial stage of the process, the level of the fluid surface around the substrate 55 is lowered through a first range of levels while holding the substrate surface at first holding points 63 outside the first range of levels. In at least one second stage, the level of the fluid surface around the substrate 55 is lowered through a second range of levels while holding the substrate at second holding points 63 outside the second range of levels. Additional stages can be used depending on the shape and size of the substrates 55 and the arrangement of holding clamps. The different stages allow lowering of the fluid level to cause liquid residue to flow off the substrate surface without intersection of the fluid surface level 52 with the contact surfaces. The multi-point holding system prevents streaking or staining of the substrate surface at the holding points 63 by preventing trapping or containment of droplets of residual liquid or fluid at points 63 where the holding clamp contact the substrate 55. The multi-point holder 62 provides means for holding the substrate surface at holding points 63 outside the range of levels while lowering of the fluid surface level 52. The fluid surface level 52 forms a single and uniform line of contact with the substrate surface that does not interfere with or cross over the holding point structures. The resultant structure cleans residual liquid from the substrate surface without streaking or staining of the substrate surface.

Preferably, a partial pressure of a vapor is maintained immediately over the fluid by introducing vapor through vapor inlets 85 that move in relation to the fluid surface level 52. For example, when the fluid surface level 52 of the fluid in the reservoir 40 is lowered by draining the fluid or by raising the substrates 55, residual liquid on the substrate surface flows off the substrate surface. More preferably, the exhaust ports 120 that exhaust vapor from the chamber 25, also move in relation to movement of the fluid surface level 52. Most preferably, the vapor inlets and exhaust ports 115, 120 float on the fluid surface level 52 so that the position of the vapor inlets 85 and exhaust 90 is automatically adjusted as the fluid surface level 52 changes.

The present invention provides several significant advantages over the prior art. First, low levels of residual liquid remain on the substrate surface. Typically only about 1 to 10 nm of water film remain on the surface of the substrate 55 after operation of the drying apparatus 20, as compared to about 100 nm of water film remaining after conventional spin rinse drying. Furthermore, the low concentration of isopropanol and alcohol used in the present apparatus 20 results in virtually undetectable organic residues remaining on the substrate surface. Also, both the fluid and the vapor are non-toxic materials which allow safe operation. Another advantage is that the substrates 55 are not subject to the stresses and potential damage associates with spin drying. Thus, the present drying apparatus 20 offers significant advantages over prior art apparatus.

The control system used to control operation of the drying apparatus 20 during implementation of the process steps described herein, comprises a computer program product that runs on a conventional computer system comprising a central processor unit (CPU) interconnected to a memory system with peripheral control components, such as for example a 68040 microprocessor, commercially available from Synenergy Microsystems, California. A video interface terminal and a light pen or keyboard provides an interface for the programmer or operator of the apparatus. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. Code text in high level languages is compiled and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

A user enters process operation data sets via the video interface terminal, the process data sets being predetermined sets of parameters needed to carry out specified tasks in the drying chamber 25. A sequencer subroutine includes a program code to perform the steps of (i) monitoring the flow rates of fluid and vapor into the chamber 25, (ii) determining the status of the substrates in the chamber and the substrates 55 in the transfer chamber that awaiting loading into the drying chamber 25, (iii) executing the multi-point holder 62 subroutine that is used to actuate the multi-point holder 62 to hold the substrates at different point during the substrate lifting and/or fluid lowering stages, and optionally (iv) executing the fluid lowering systems to lower the surface level of the fluid in the drying chamber 25. Conventional methods of monitoring the status of the drying chamber 25 and the substrates 55 can be used, such as polling. When scheduling which process is to be executed, the sequencer subroutine can take into consideration the present condition of the drying chamber 25 in comparison with the desired process conditions for a selected process, or the "age" of each particular user entered request, or any other relevant factor a system programmer desires to include for determining scheduling priorities.

Once the sequencer subroutine determines which process data set combination is going to be executed next, the sequencer subroutine causes execution of the process data set by passing the particular process data set parameters to a chamber manager subroutine which controls multiple processing tasks in the drying chamber 25 according to the process data set determined by the sequencer subroutine. For example, the drying chamber manager subroutine can comprise program code for controlling fluid and vapor flow rates and flow levels within the drying chamber 25. The chamber manager subroutine also controls execution of various chamber component subroutines or program code modules, which control operation of the drying chamber 25 components necessary to carry out the selected process set. Examples of such component subroutines are substrate holding program code, fluid level control program code, vapor pressure control program code, and the inlet and exhaust program code. Those having ordinary skill in the art would readily recognize that other drying chamber control program codes or subroutines can be included depending on the steps in the drying process desired to be performed in the chamber 25.

For example, a computer program product suitable for operating the drying chamber comprises computer readable program code comprising (1) vapor distribution control code for introducing vapor into the chamber; (2) fluid system control code for dispensing fluid into the reservoir 40, and adjusting a fluid surface level 52 in the reservoir; and (3) multi-point holder control code for actuating a multi-point holder 62 to hold the substrate 55 at different holding points on the substrate so that a lowering fluid surface level does not pass across a holding point that is being used to hold the substrate. The vapor distribution code controls motion of one or more of the movable vapor inlet 85 having inlet ports 115 for introducing vapor into the chamber 25, and a movable vapor exhaust 90 having exhaust ports 120 for exhausting vapor. The fluid system control code comprises code for controlling operation of lowering means for lowering the fluid surface level 52 through a range of levels. The multi-point holder control code operates the multi-point holder 62 to hold the substrate 55 at first holding points while the fluid surface level 52 is lowered through a first range of levels that do not pass across the first holding points, and holds substrate at second holding points while the fluid surface level is lowered through a second range of levels that do not pass across the second holding points. Such a basic program structure can operate and control the drying chamber 25 and regulate the transfer and motion of substrates 55 into and out of the chamber.

While the present invention has been described in considerable detail with reference to certain preferred versions, many other versions should be apparent to those skilled in the art. For example, the drying apparatus can comprise equivalent holding mechanisms for raising or lowering the substrates in the fluid, or for controlling the fluid surface level in the dryer tank, for example, by causing overflowing of the fluid surface level at predefined rates. Therefore, the spirit and scope of the claims herein should not be limited to the description of the preferred versions illustrated herein.

What is claimed is:

1. A method of removing liquid on a substrate, the method comprising the steps of:

(a) immersing the substrate in a fluid having a surface level;
   (b) maintaining a partial pressure of vapor over the fluid surface level;
   (c) lowering the fluid surface level of the reservoir while adding fluid, whereby the liquid flows off the substrate; and
   (d) holding the substrate at different holding points, while lowering the fluid surface level so that the lowering surface level does not pass across a holding point that is being used to hold the substrate.

2. The method of claim 1 wherein the step of holding the substrate at different holding points comprises holding the substrate at different holding points that are selected in relation to the position of the fluid surface level.

3. The method of claim 1 wherein the step of holding the substrate at different holding points comprises holding the substrate at first holding points while the fluid surface level is lowered through a first range of levels, and holding the substrate at second holding points while the fluid surface level is lowered through a second range of levels.

4. The method of claim 1 wherein step (b) comprises the step of moving a vapor inlet or vapor exhaust in relation to the lowering fluid surface level, the vapor inlet having inlet ports for introducing the vapor over the fluid surface level, and the vapor exhaust having exhaust ports for exhausting the vapor.

5. The method of claim 4 wherein step (b) comprises the step of floating the vapor inlet or vapor exhaust on the fluid surface level.

6. A method of removing liquid on a substrate, the method comprising the steps of:

(a) placing the substrate in a fluid reservoir having a fluid surface level;
   (b) maintaining a partial pressure of vapor over the fluid surface level while adding fluid;
   (c) in a first stage, lowering the fluid surface level of the reservoir through a first range of levels while holding the substrate at first holding points; and
   (d) in at least one second stage, lowering the fluid surface level of the reservoir through a second range of levels while holding the substrate at second holding points, whereby the liquid flows off the substrate.

7. The method of claim 6 wherein in the first stage, the first holding points comprise holding points positioned outside the first range of levels, and where in the second stage, the second holding points comprise holding points outside the second range of levels.

8. The method of claim 7 wherein the first and second holding points each comprise at least three holding points.

9. The method of claim 6 wherein step (b) comprises moving a vapor inlet or vapor exhaust in relation to the lowering fluid surface level, the vapor inlet having inlet ports for introducing the vapor over the fluid surface level, and the vapor exhaust having exhaust ports for exhausting the vapor.

10. The method of claim 9 comprising the step of floating the vapor inlet or vapor exhaust on the fluid surface level.

11. A method of removing liquid on a substrate, the method comprising the steps of:

(a) placing the substrate in a fluid reservoir having a fluid surface level;
   (b) maintaining a partial pressure of vapor over the fluid surface level by introducing vapor through a vapor inlet port that moves in relation to the fluid surface level, while adding fluid; and (c) lowering the fluid surface level of the reservoir, whereby the liquid flows off the substrate.

12. The method of claim 11 wherein step (b) further comprises the step of exhausting vapor over the fluid surface level through a vapor exhaust port that moves in relation to the fluid surface level.

13. The method of claim 12 wherein step (b) comprises the step of floating the vapor inlet port and vapor exhaust port on the fluid surface level.

14. The method of claim 11 wherein step (c) comprises the step of draining the fluid.

15. The method of claim 11 wherein step (c) comprises the step of holding the substrate at different holding points while lowering the fluid surface level so that the fluid surface level does not intersect a holding point on the substrate.

16. A method of removing liquid on a substrate, the method comprising the steps of:
   (a) placing the substrate in fluid having a surface level;
   (b) maintaining a partial pressure of vapor in an enclosed vapor zone over the fluid surface level;
   (c) lowering the fluid surface level relative to the substrate, whereby the liquid flows off the substrate; and
   (d) holding the substrate at different holding points, while lowering the fluid surface level so that the fluid surface level does not pass across a holding point that is being used to hold the substrate.

17. The method of claim 16 comprising the step of holding the substrate at different holding points that are selected in relation to the position of the fluid surface level.

18. The method of claim 16 comprising the step of holding the substrate at first holding points while the fluid surface level is lowered through a first range of levels, and holding the substrate at second holding points while the fluid surface level is lowered through a second range of levels.

19. The method of claim 16 wherein step (b) comprises the step of moving a vapor inlet or vapor exhaust in relation to the fluid surface level being lowered, the vapor inlet having inlet ports for introducing the vapor over the fluid surface level, and the vapor exhaust having exhaust ports for exhausting the vapor.

20. The method of claim 19 wherein step (b) comprises the step of floating the vapor inlet or vapor exhaust on the fluid surface level.

21. A method of removing liquid on a substrate, the method comprising the steps of:
   (a) placing the substrate in fluid having a fluid surface level;
   (b) maintaining a partial pressure of vapor in an enclosed vapor zone over the fluid surface level;
   (c) in a first stage, lowering the fluid surface level relative to the substrate through a first range of levels while holding the substrate at first holding points; and
   (d) in at least one second stage, lowering the fluid surface level through a second range of levels while holding the substrate at second holding points, whereby the liquid flows off the substrate.

22. The method of claim 21 wherein in the first stage, the first holding points comprise holding points positioned outside the first range of levels, and where in the second stage, the second holding points comprise holding points outside the second range of levels.

23. The method of claim 22 wherein the first and second holding points each comprise at least three holding points.

24. The method of claim 21 wherein step (b) comprises moving a vapor inlet or vapor exhaust in relation to the lowering fluid surface level, the vapor inlet having inlet ports for introducing the vapor over the fluid surface level, and the vapor exhaust having exhaust ports for exhausting the vapor.

25. The method of claim 24 comprising the step of floating the vapor inlet or vapor exhaust on the fluid surface level.

26. A method of removing liquid on a substrate, the method comprising the steps of:
   (a) placing the substrate in fluid having a fluid surface level;
   (b) maintaining a partial pressure of vapor in an enclosed vapor zone over the fluid surface level by introducing vapor through a vapor inlet port that moves in relation to the fluid surface level; and
   (c) lowering the fluid surface level relative to the substrate, whereby the liquid flows off the substrate.

27. The method of claim 26 wherein step (b) further comprises the step of exhausting vapor over the fluid surface level through a vapor exhaust port that moves in relation to the fluid surface level.

28. The method of claim 27 wherein step (b) comprises the step of floating the vapor inlet port and vapor exhaust port on the fluid surface level.

29. The method of claim 26 wherein step (c) comprises the step of draining the fluid.

30. The method of claim 26 wherein step (c) comprises the step of holding the substrate at different holding points while lowering the fluid surface level so that the fluid surface level does not intersect a holding point on the substrate.

31. A method of removing liquid on a substrate, the method comprising the steps of:
   (a) placing the substrate in fluid having a fluid surface level;
   (b) maintaining a partial pressure of vapor in an enclosed vapor zone over the fluid surface level; and
   (c) lowering the fluid surface level relative to the substrate to remove the liquid on the substrate surface.

32. The method of claim 31 wherein the fluid surface level is lowered while the substrate is held at different points.

33. The method of claim 31 further comprising the step of moving a vapor inlet or vapor exhaust in relation to the fluid surface level being lowered, the vapor inlet having an inlet port for introducing the vapor over the fluid surface level, and the vapor exhaust having an exhaust port for exhausting the vapor.

34. The method of claim 33 comprising the step of floating the vapor inlet or vapor exhaust on the fluid surface level.

35. A method of removing liquid on a substrate, the method comprising the steps of:
   (a) placing the substrate in fluid having a surface level;
   (b) lowering the fluid surface level relative to the substrate, whereby the liquid flows off the substrate; and
   (c) holding the substrate at different holding points, while lowering the fluid surface level so that the lowering surface level does not pass across a holding point that is being used to hold the substrate, wherein the substrate is held at at least three spaced points throughout the step of powering the fluid surface level relative to the substrate.

36. A method of removing liquid on a substrate, the method comprising the steps of:
   (a) placing the substrate in fluid having a surface level;

(b) lowering the fluid surface level relative to the substrate, whereby the liquid flows off the substrate; and (c) holding the substrate at different holding points, while lowering the fluid surface level so that the lowering surface level does not pass across a holding point that is being used to hold the substrate, wherein the substrate has an upper half and a lower half and wherein at least one holding point is on the upper half of the substrate.

37. A method of removing liquid on a substrate, the method comprising the steps of:

(a) placing the substrate in fluid having a surface level;

(b) lowering the fluid surface level relative to the substrate, whereby the liquid flows off the substrate; and (c) holding the substrate at different holding points, while lowering the fluid surface level so that the lowering surface level does not pass across a holding point that is being used to hold the substrate, wherein the holding points are held by respective holding surfaces and wherein each holding point and respective holding surface pass across the surface level at substantially the same time.

38. A method of removing liquid on a substrate, the method comprising the steps of:

(a) placing the substrate in a fluid reservoir having a fluid surface level;

(b) maintaining a partial pressure of vapor over the fluid surface level by introducing vapor through a vapor inlet port that moves in relation to the fluid surface level;

(c) lowering the fluid surface level of the reservoir, whereby the liquid flows off the substrate; and (d) moving the vapor port in relation to the fluid surface level of the reservoir.

39. The method of claim 38 wherein step (b) further comprises the step of exhausting vapor over the fluid surface level through a vapor exhaust port that moves in relation to the fluid surface level.

40. The method of claim 39 wherein step (b) comprises the step of floating the vapor inlet port and vapor exhaust port on the fluid surface level.

41. The method of claim 38 wherein step (c) comprises the step of draining the fluid.

42. The method of claim 38 wherein step (c) comprises the step of holding the substrate at different holding points while lowering the fluid surface level so that the fluid surface level does not intersect a holding point on the substrate.

* * * * *